United States Patent
Honda et al.

(10) Patent No.: US 7,345,278 B2
(45) Date of Patent: Mar. 18, 2008

(54) INFRARED RAY DETECTION DEVICE, METHOD OF FABRICATING THE SAME AND INFRARED RAY CAMERA

(75) Inventors: Hiroto Honda, Tokyo (JP); Ikuo Fujiwara, Yokohama (JP); Masahiro Kuwata, Kawasaki (JP); Kei Masunishi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/616,660

(22) Filed: Dec. 27, 2006

(65) Prior Publication Data
US 2007/0170361 A1 Jul. 26, 2007

(30) Foreign Application Priority Data
Dec. 28, 2005 (JP) ............... 2005-378445

(51) Int. Cl.
G01J 5/00 (2006.01)
H01L 25/00 (2006.01)
(52) U.S. Cl. ................... 250/338.1; 250/332
(58) Field of Classification Search ........... 250/332, 250/338.1–338.5, 316.1, 330, 339.01–339.15, 250/341.8
See application file for complete search history.

(56) References Cited

U.S. PATENT DOCUMENTS

2003/0168598 A1* 9/2003 Oda .................. 250/338.1
2004/0159788 A1* 8/2004 Shigenaka et al. ........ 250/338.1
2005/0061980 A1* 3/2005 Iida et al. ................ 250/338.4

FOREIGN PATENT DOCUMENTS

JP 2002-107224 10/2002
JP 2003106894 A * 4/2003

OTHER PUBLICATIONS

Kosasayama et al., Pixel Scaling for SOI Diode Uncooled Infrared Focal Plane Arrays, Proc. SPIE vol. 5406, pp. 504-511, 2004.

* cited by examiner

Primary Examiner—Kimberly D. Nguyen
Assistant Examiner—Kiho Kim
(74) Attorney, Agent, or Firm—Amin, Turocy & Calvin, LLP

(57) ABSTRACT

An infrared ray detection device has a detection cell which has a thermoelectric converting part and an infrared ray absorption layer formed via a space on a semiconductor substrate, a first wiring part formed on the semiconductor substrate, and a supporting part, the detection cell being formed via the space on the semiconductor substrate and supports the detection cell. The supporting part includes a plurality of supporting legs which have a second wiring part electrically connecting the first wiring part to the detection cell and an insulating part covering a surrounding are of the second wiring part, and at least one connection part made of an insulating material connecting the plurality of supporting legs to each other.

20 Claims, 10 Drawing Sheets

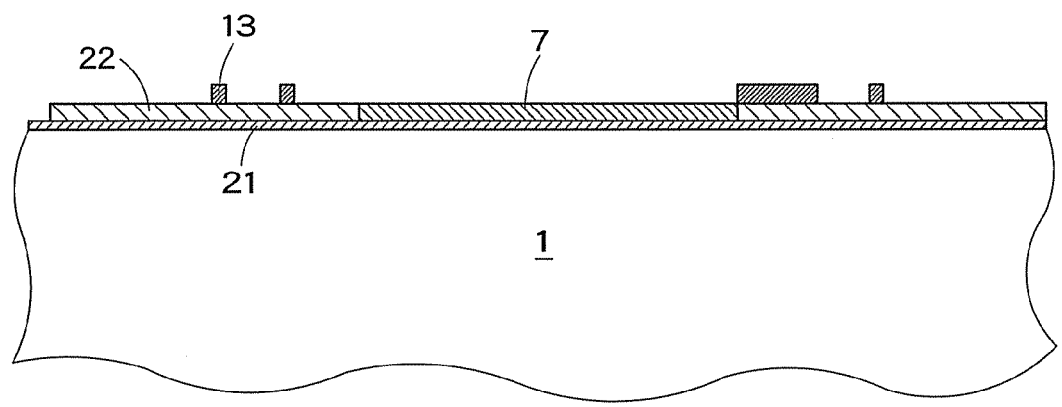
F I G. 5
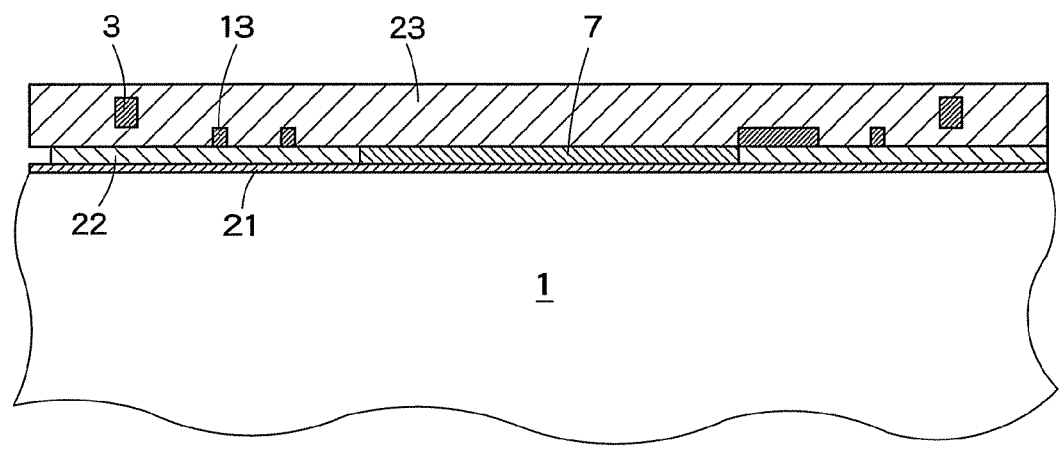
F I G. 6
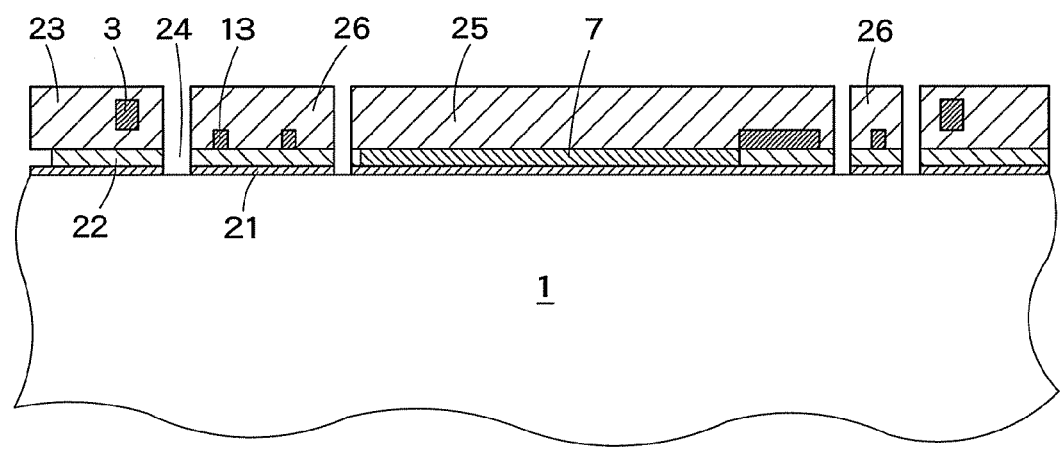
F I G. 7

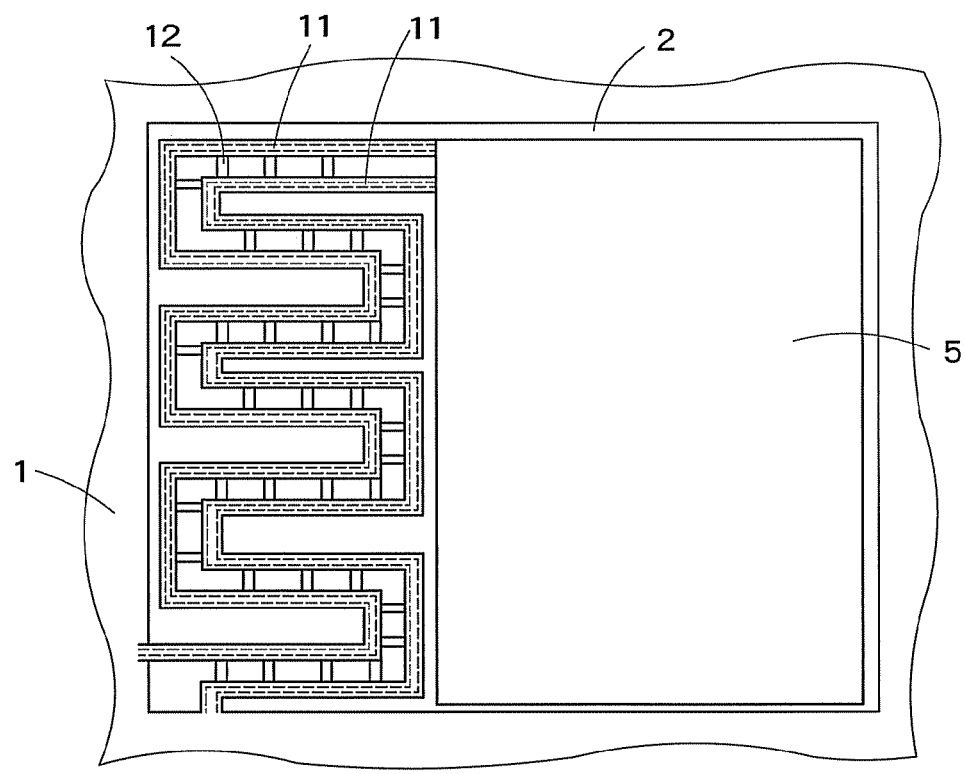
F I G. 12
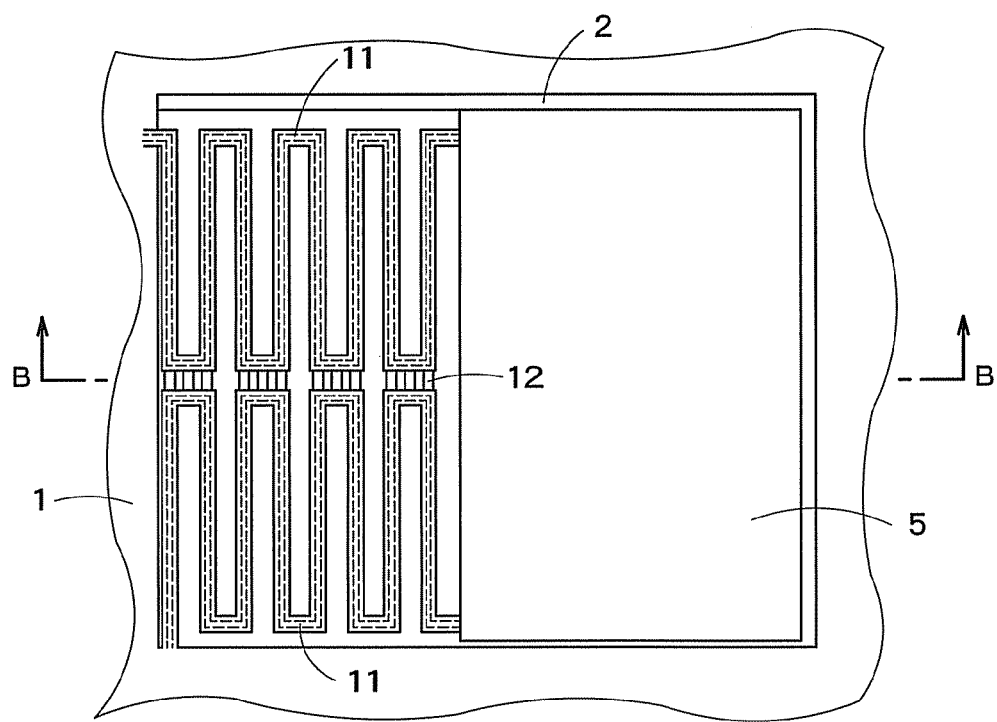
F I G. 13

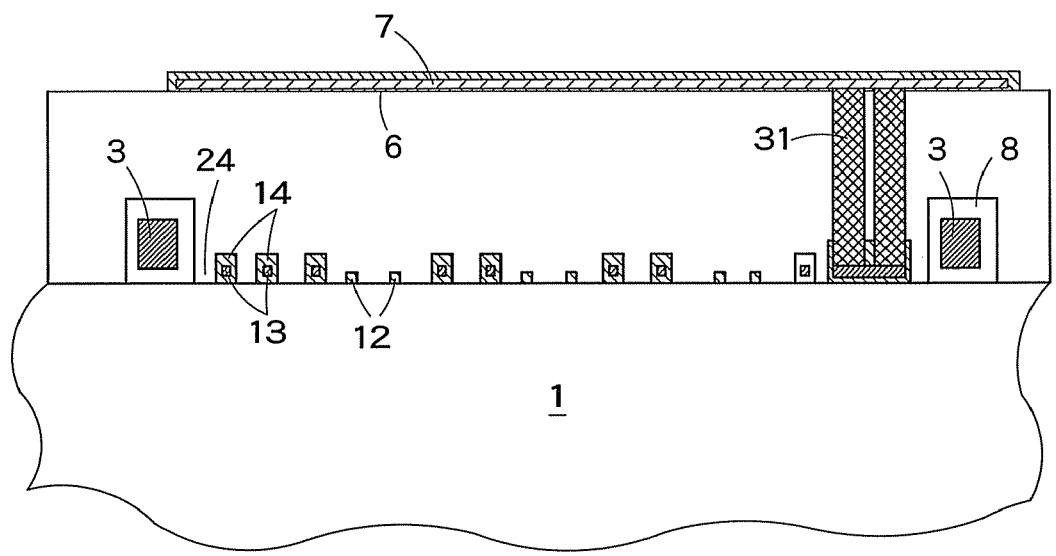
F I G. 18
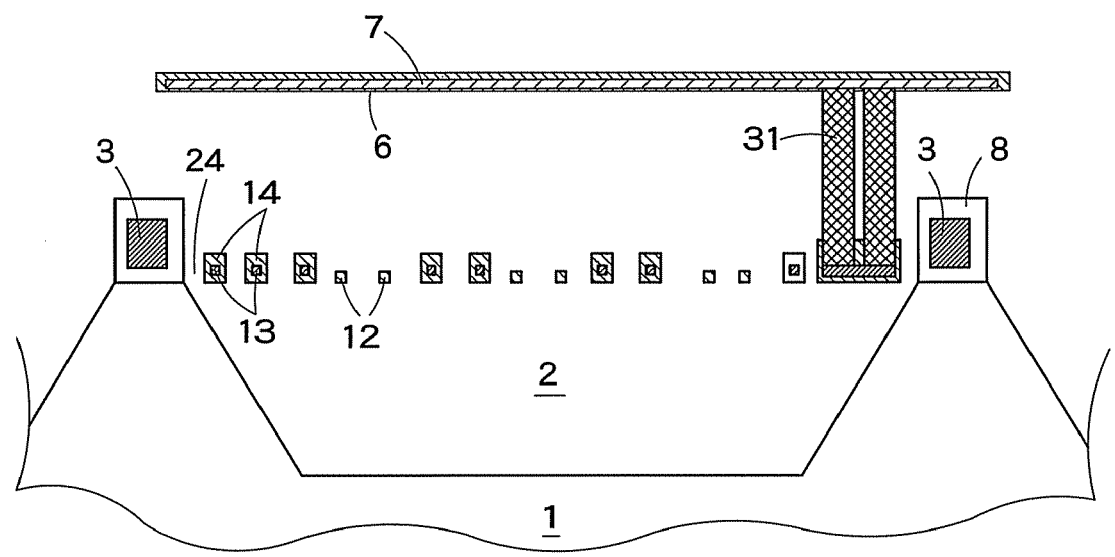
F I G. 19

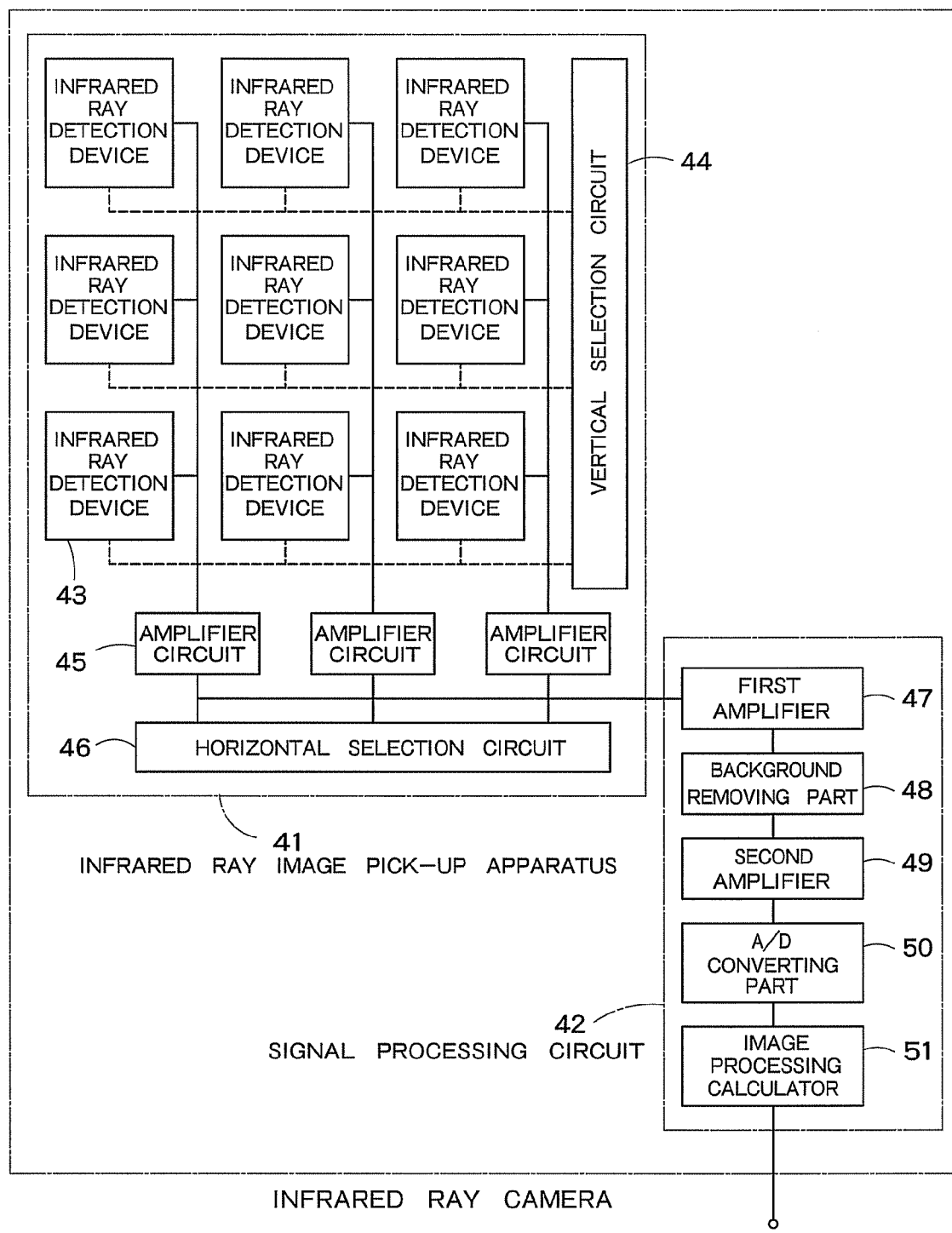
F I G. 20

INFRARED RAY DETECTION DEVICE, METHOD OF FABRICATING THE SAME AND INFRARED RAY CAMERA

CROSS REFERENCE TO RELATED APPLICATIONS

This application is based upon and claims the benefit of priority from the prior Japanese Patent Application No. 2005-378445, filed on Dec. 28, 2005, the entire contents of which are incorporated herein by reference.

BACKGROUND OF THE INVENTION

1. Field of the Invention

The present invention relates to an infrared ray detection device, a method of fabricating the same and an infrared ray camera which have structure for supporting a detection cell by a supporting part.

2. Related Art

A non-cooling (thermal) type infrared ray sensor is a device which absorbs a focused infrared ray by an infrared ray detector to convert radiation energy of the infrared ray into electric signals. The sensor has a characteristic in which detection cells made of an infrared ray-absorption material and a thermoelectric conversion device are thermally separated from outside. In order to realize such a structure, a technique of surface micromachining or bulk micromachining is necessary. The non-cooling (or uncooled) type infrared ray sensor has an advantage in which it is possible to reduce production cost and size, compared with a cooling infrared ray sensor which requires an expensive and large cooler.

In order to perform thermal separation, it is important to install the detection cell under vacuum and to lower thermal conductance of a supporting structure for physically and electrically connecting the detection cells to a substrate. The thermal conductance of the supporting structure becomes smaller as the supporting structure is finer. Therefore, in order to improve sensitivity of the sensor, it is necessary to reduce design rule of semiconductor process for forming the above structure (see JP-A 2002-107224 (Kokai)).

In the above document, the cross sectional structure of a supporting leg for supporting the detection cells has a wiring part and an insulating part for protecting the wiring part. If the wiring part is formed in shape shifted in left or right direction from the center of the insulating part, the supporting leg is distorted in a substrate-surface direction, thereby causing physical contact. The shift of the wiring part occurs due to mask matching displacement of photolithography in the process for forming the supporting leg. The width of the supporting leg is 1 μm or less. Even when the wiring part is shifted 0.1 μm, a large distortion occurs. Therefore, matching accuracy has to be restrained within 0.1 μm or less.

Sensitivity of the non-cooling infrared ray sensor is inversely proportional to thermal conductance of the supporting leg. If the supporting leg contacts some part on a thermal transmission path, thermal insulation performance of the detection cell deteriorates significantly. Such a structural problem occurs due to external cause such as mechanical shock or dripping as well as structural stress by the structure itself.

The stress includes a thermal stress caused by a difference between a processing temperature at a time of forming the structure and a device operational temperature and an internal stress caused by a material forming of the structure. If the structure is spatially symmetric, these stresses are canceled inside of the structure. However, if the structure is asymmetry, the structure is deformed in an asymmetric direction.

In order to avoid requirement of such a strict matching accuracy, a robust supporting leg structure capable of reducing the distortion due to the internal stress is necessary.

SUMMARY OF THE INVENTION

The present invention provides an infrared ray detection device, a method of fabrication the same and an infrared ray camera which do not lose thermal insulation performance of the detection cell even if the stress is applied.

According to one embodiment of the present invention, an infrared ray detection device, comprising:

a detection cell which has a thermoelectric converting part and an infrared ray absorption layer, the detection cell being formed via a space on a semiconductor substrate;

a first wiring part formed on the semiconductor substrate; and a supporting part which supports the detection cell, wherein the supporting part includes:

a plurality of supporting legs which have a second wiring part electrically connecting the first wiring part to the detection cell and an insulating part covering a surrounding are of the second wiring part; and at least one connection part made of an insulating material connecting the plurality of supporting legs to each other.

According to one embodiment of the present invention, a method of fabricating an infrared ray detection device, comprising:

forming a thermoelectric conversion part for a detection cell and a first wiring part for a supporting part on a semiconductor substrate;

covering the semiconductor substrate with a protective insulating part and forming a second wiring part;

removing a portion of the protective insulating part to expose the semiconductor substrate;

removing a portion of the semiconductor substrate from the exposed area of the semiconductor substrate to form a concave portion below the thermoelectric conversion part, the first wiring part and the surrounding protective insulating part; and shaping a portion of the protective insulating part on the concave portion to form a plurality of supporting legs and at least one connection part which is made of an insulating material and connects the plurality of supporting legs, the supporting legs and the connection part constituting the supporting part.

According to one embodiment of the present invention, an infrared ray camera, comprising:

an infrared ray detection apparatus which sequentially outputs an infrared ray detection signal detected by a plurality of infrared ray detection devices aligned in row and column directions; and a signal processing circuit which performs signal process for the output signal of the infrared ray detection apparatus, wherein each of the plurality of infrared ray detection devices has:

a detection cell which has a thermoelectric conversion part and an infrared ray absorption layer formed via a space on the semiconductor substrate;

a first wiring part formed on the semiconductor substrate; and a supporting part which supports the detection cell formed on the semiconductor substrate, the supporting part includes:

a plurality of supporting legs, each having a second wiring part electrically connecting the first wiring part and the detection cell, and a supporting insulating part covering a surrounding area of the second wiring part; and at least one connection part made of an insulating material connecting the plurality of supporting legs to each other.

BRIEF DESCRIPTION OF THE DRAWINGS

FIG. 5 is a cross-sectional view showing procedures of fabrication steps of the infrared ray detection device according to the present embodiment.

FIG. 6 is a view subsequent to FIG. 5.

FIG. 7 is a view subsequent to FIG. 6.

FIG. 12 is a plan view of the infrared ray detection device according to the third embodiment of the present invention.

FIG. 13 is a plan view of the infrared ray detection device according to the fourth embodiment of the present invention.

FIG. 18 is a view subsequent to FIG. 17.

FIG. 19 is a view subsequent to FIG. 18.

FIG. 20 is a block diagram showing schematic configuration of the infrared ray camera according to the sixth embodiment of the present invention.

DETAILED DESCRIPTION OF THE INVENTION

Hereafter, an infrared ray detector and an infrared ray detecting method according to the present invention will be described more specifically with reference to the drawings.

First Embodiment

Figure 1:
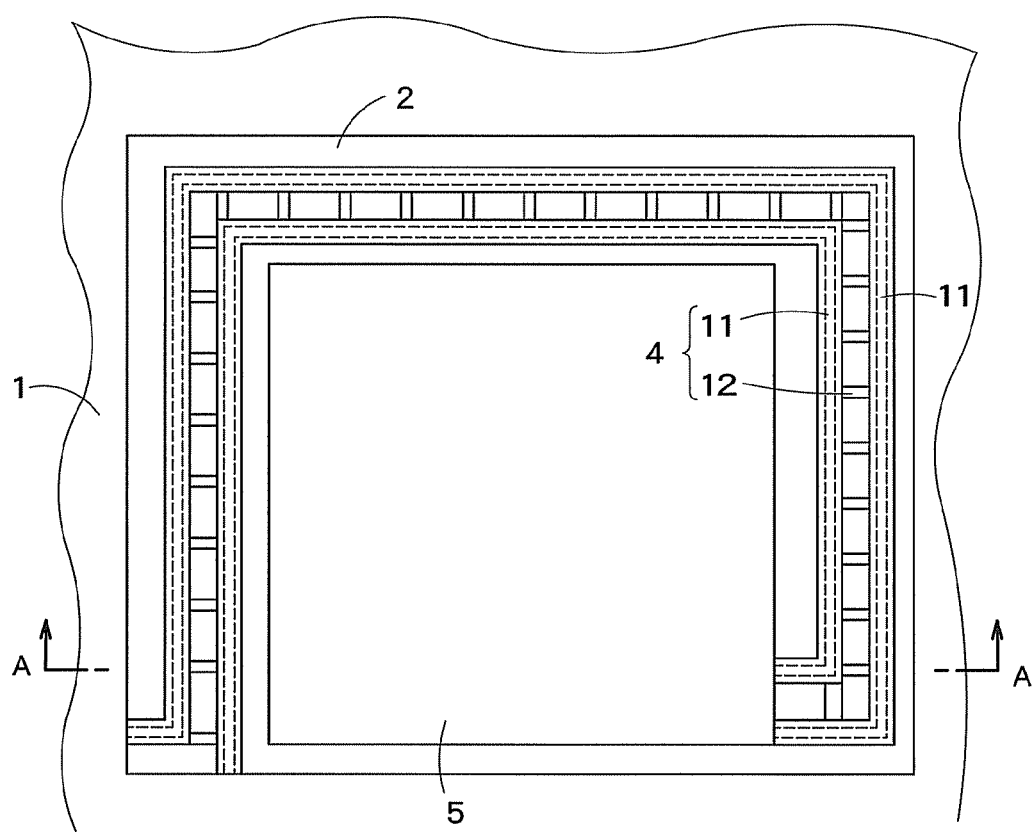
FIG. 1 is a plan view of an infrared ray detection device according to a first embodiment of the present invention.
Figure 2:
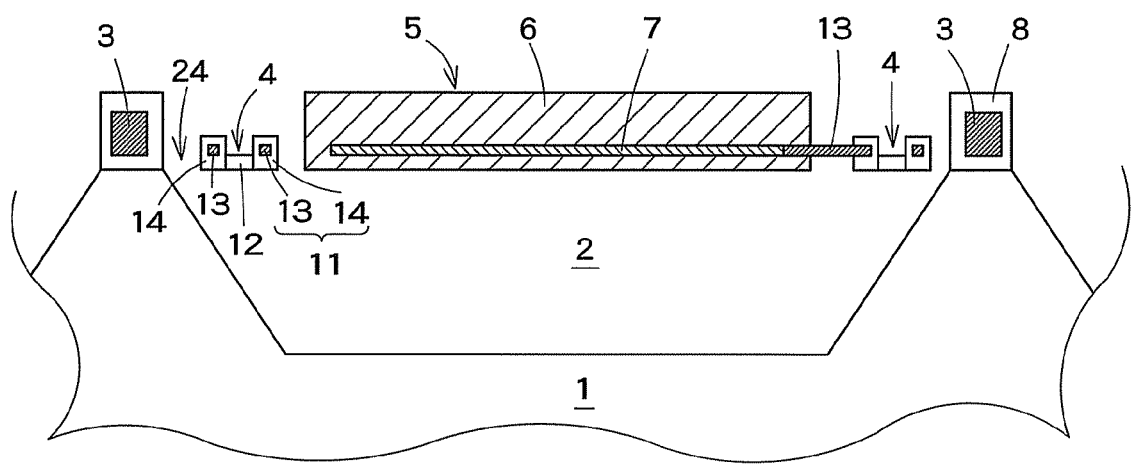
FIG. 2 is a cross-sectional view on line A-A of FIG. 1.

FIG. 1 is a plan view of an infrared ray detection device according to a first embodiment of the present invention, and FIG. 2 is a cross-sectional view on line A-A of FIG. 1. The infrared ray detection device shown in FIGS. 1 and 2 has a concave portion formed on a semiconductor substrate 1, a wiring part 3 formed on the semiconductor substrate 1 in vicinity of the concave portion 2, a wiring protective part 8 made of an insulating material, which covers a surrounding area of the wiring part 3, a supporting part 4 formed inside of or above the concave portion 2, and a detection cell 5 which is arranged inside of or above the concave portion 2 and is supported by the supporting part 4.

The detection cell 5 has an infrared ray absorption layer 6 which absorbs the infrared ray and generates heat, and a thermoelectric conversion part 7 which converts heat occurred by the infrared ray absorption layer 6 into an electric signal.

The thermoelectric conversion part 7 has a pn junction, and uses temperature dependence of forward characteristics of the pn junction to read out fluctuation of the forward voltage under a condition of a constant current. The output signal of the thermoelectric conversion part 7 is expressed by the following equation (1), where $I_{light}$ is an incoming infrared ray power, $\gamma$ is absorption efficiency, $A_D$ is an infrared ray absorption area per one pixel, $G_{th}$ is a thermal conductance from the detection cell to the semiconductor substrate 1, and dV/dT is a thermoelectric conversion coefficient of the pn junction.

$$\frac{I_{light} A_D \gamma}{G_{th}} \frac{dV}{dT} \tag{1}$$

In the equation (1), $G_{th}$ is the thermal conductance of the supporting part 4 and is expressed by the following equation (2).

$$G_{th} = \kappa NA/L$$

In the equation (2), "$\kappa$" is a thermal conductivity depending on the material of the supporting part 4, "A" is the cross-sectional area of the supporting leg 11, "L" is the length of the supporting part 4, and "N" is the number of the supporting part 4.

The above equation (1) expresses sensitivity of the infrared ray detection devices. The sensitivity is inversely proportional to the thermal conductance Gth between the detection cell 5 and the semiconductor substrate 1, as apparent from the equation (1). Therefore, it is possible to improve the sensitivity of the infrared ray detection device by thermally separating the semiconductor substrate 1 from the wiring part 3. The thermal separation is performed by the concave portion 2 on the semiconductor substrate 1.

As shown in FIG. 1, the supporting part 4 has two supporting legs 11 and a plurality of connection parts 12 made of an insulating material connecting the supporting parts 4. Each of the supporting legs 11 has a supporting wiring part 13 which electrically connects the wiring part 3 and the detection cell 5, and a supporting insulating part 14 which covers the surrounding area of the supporting wiring part 13.

The supporting wiring part 13 is made of a conductive material such as a metal. The thermal conductance $g_{th}$ per a unit length of the supporting wiring part 13 is expressed by the following equation (3), where $\kappa_M$ is the thermal conductivity of the supporting wiring part 13, and $K_I$ is the thermal conductivity of the supporting insulating part 14.

$$g_{th} = A_M \kappa_M + A_I k_I \tag{3}$$

Here, when the supporting wiring part 13 is made of poly-silicon and the supporting insulating part 14 is made of silicon dioxide, the following equations (4) and (5) are established.

$$k_M = 20 W/m \cdot K \tag{4}$$

$$k_I = 1.4 W/m \cdot K \tag{5}$$

If $A_M$ is equal to $A_P$, most of the heat is transmitted to the supporting wiring part 13, as apparent from the equation (3).

When the cross-sectional shape of the supporting legs 11 are asymmetric, that is, when the supporting wiring part 13 in the supporting legs 11 is formed at a shifted location from a center, a distortion occurs in a substrate-surface direction or a substrate-depth direction due to a stress worked in a direction parallel to the cross-section of the supporting legs 11. The stress includes the thermal stress and the internal stress. The thermal stress is a stress generated by a difference between thermal expansion coefficients (CTE) of the materials of the supporting wiring part 13 and the supporting insulating part 14, when the thermal expansion (thermal contraction) occurs according to the difference between the fabrication temperature and the operational temperature of the supporting wiring part 13 and the supporting insulating part 14. The internal stress is a stress that the supporting insulating parts 13 and 14 originally have.

As the cross-sectional area of the supporting legs 11 becomes smaller, and as the location of the supporting wiring part 13 in the supporting legs 11 is shifted more largely from a center, the amount of displacement due to the stress becomes larger.

Figure 3:
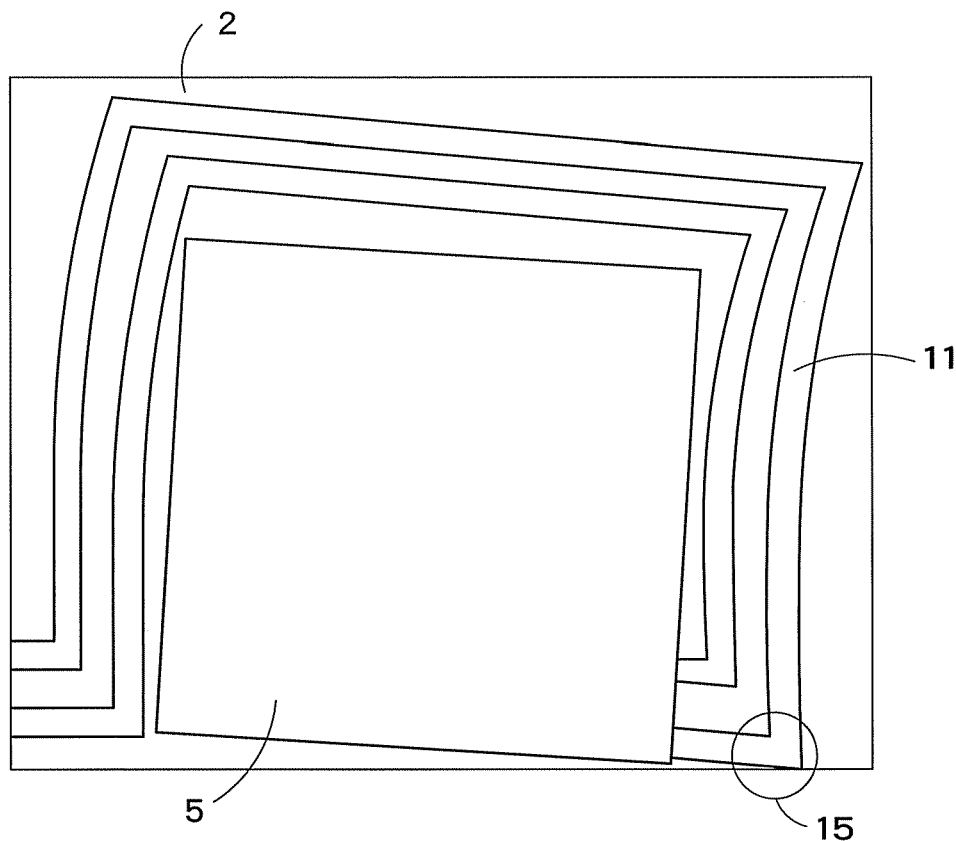
FIG. 3 is a view in which supporting legs suffer from stresses.

When such a stress occurs, the supporting wiring part 13 distorts in the substrate-surface direction, for example, as shown in FIG. 3, and the supporting legs 11 may contact the semiconductor substrate 1 at a partial area 15. When the supporting legs 11 contact the semiconductor substrate 1, thermal insulation performance is lost and the thermal conductance becomes very large.

It is desirable that the cross-sectional size of the supporting legs 11 is 1 μm×1 μm or less, and the length thereof is several dozen μm. If the shift amount of the supporting wiring part 13 is 0.1 μm in the substrate-surface direction, the supporting legs 11 having size of 20 μm shifts about 1 μm in the substrate-surface direction. This means that matching miss accuracy of the mask for photolithography in the case of forming the below-mentioned hole used for forming the concave portion 2 has to be set to 0.1 μm or less.

Therefore, the present embodiment provides the connection parts 12 between two supporting legs 11 in order to cancel the distortion due to the internal stress to make it unnecessary to improve the matching miss accuracy of the mask. The connection parts 12 are arranged at a constant interval in a direction substantially orthogonal to a direction where the supporting legs 11 extend. The number of the connection parts 12, a location and an interval of the connection parts 12 are not especially limited in this embodiment.

The connection parts 12 are arranged in a direction substantially orthogonal to the extended direction of two supporting legs 11. The temperature of the supporting legs 11 at both ends of the connection parts 12 is substantially the same. Therefore, heat due to the temperature difference does not flow through the connection parts 12. Therefore, even if the connection parts 12 are arranged between the supporting legs 12, the thermal conductance in the whole supporting part 4 does not increase.

Figure 4:
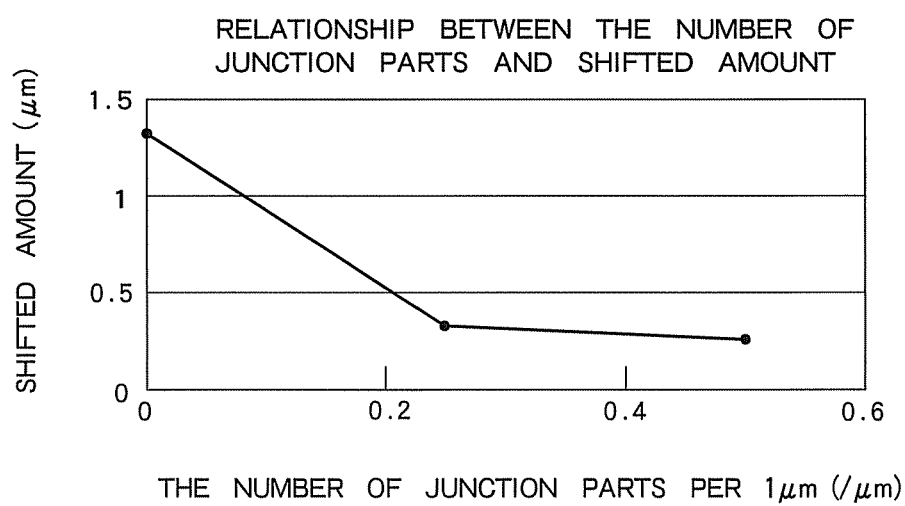
FIG. 4 is a graph showing a simulation result relating to a relationship between the interval of the connection parts 12 and the shifted amount in the substrate-surface direction of the supporting legs 11.

FIG. 4 is a graph showing a simulation result relating to a relationship between the interval of the connection parts 12 and the shifted amount in the substrate-surface direction of the supporting legs 11. A horizontal axis of FIG. 4 shows the number of the connection parts 12 per 1 μm, and a vertical axis shows the shifted amount (μm) of the supporting legs 11. Here, a detailed simulation condition is omitted. However, it is apparently possible to sufficiently reduce the shifted amount in the substrate-surface direction when about five connection parts 12 are formed at equal interval on the supporting legs 11 of which total length is 20 μm.

When a plurality of connection parts 12 are formed at equal interval between two supporting legs 11, the location of the connection parts 12 is not affected on the distortion of the supporting legs 11, and it is unnecessary to improve the mask matching accuracy.

FIGS. 5-9 are cross-sectional views showing procedures of fabrication steps of the infrared ray detection device according to the present embodiment. Firstly, the protective insulating part 21 is formed on the semiconductor substrate 1, and the thermoelectric conversion part 7 and the protective insulating part 22 are formed adjacent to each other. When an SOI substrate is used as the semiconductor substrate, an embedded oxide film in the SOI substrate may be used as the protective insulating part 21. The thermoelectric conversion part 7 is a pn diode made of, for example, mono-silicon. The protective insulating film 22 formed adjacent to the thermoelectric conversion part 7 functions as a device isolation region made of, for example, silicon dioxide.

Next, a metal film is formed on the protective insulating part 22, and the metal film is subjected to patterning to form the supporting wiring part 13. The material of the metal film is, for example, poly-silicon of high impurity concentration used as MOSFET gate material (FIG. 5).

Next, the protective insulating film 23 is formed on the whole substrate on which the supporting wiring part 13 is formed, and the wiring part 3 is formed thereon. Then, the metal film is subjected to patterning to form the wiring part 3. Subsequently, the protective insulating film 23 is again formed on the whole substrate (FIG. 6).

Next, holes 24 are formed by anisotropic etching such as RIE on a portion of the substrate to expose the surface of the semiconductor substrate 1 (FIG. 7). By this fabrication step, an area 25 on which the detection cell 5 is formed and an area 26 on which the supporting part 4 is formed are formed separate from each other. At this time, patterning is performed to form the supporting legs 11 and the connection parts 12. A photo-resist exposure step of forming the holes 24 generally requires a strict mask matching accuracy.

Figure 8:
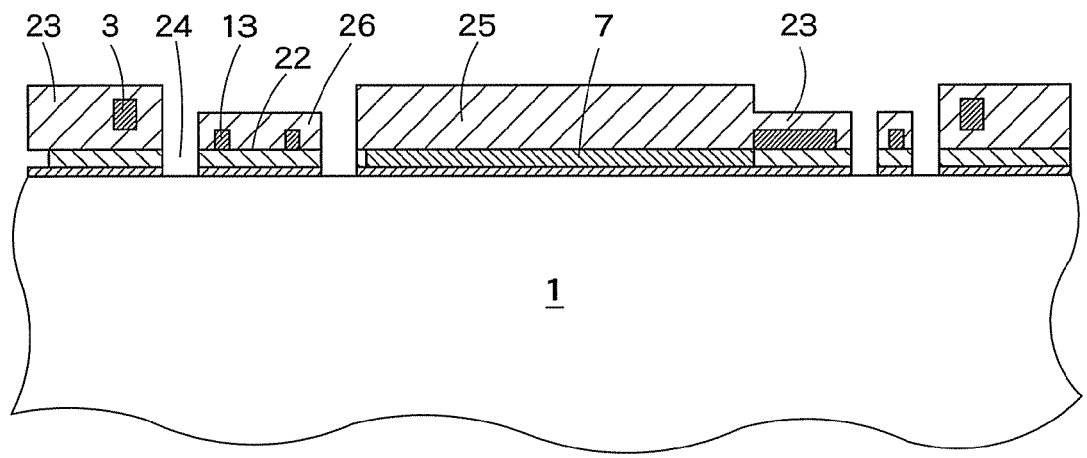
FIG. 8 is a view subsequent to FIG. 7.

Next, for example, by performing the anisotropic etching such as RIE, a portion of the protective insulating part 23 is trimmed in substrate-depth direction to form the supporting insulating part 14 and the connection parts 12 in the supporting part 4 (FIG. 8). This fabrication step is provided to lower the thermal conductance of the supporting legs 11.

Figure 9:
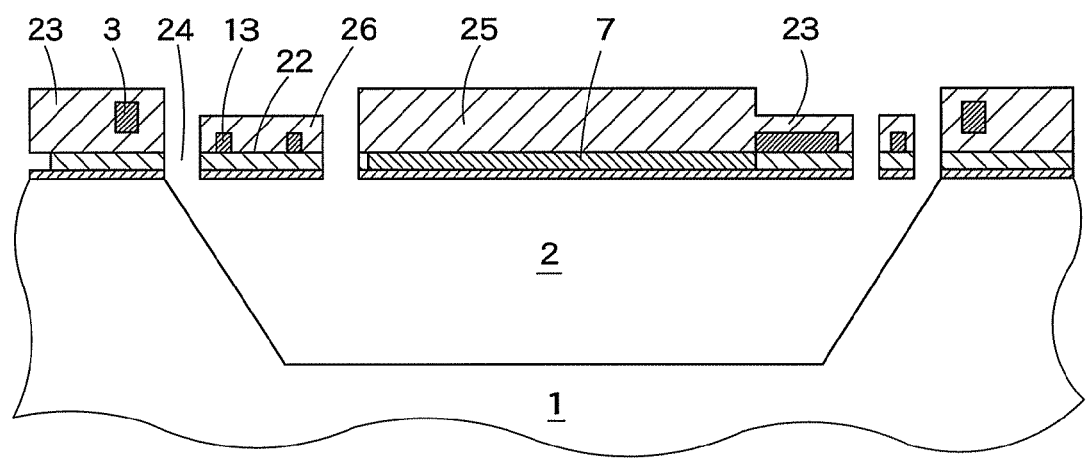
FIG. 9 is a view subsequent to FIG. 8.

Next, the semiconductor substrate 1 is gradually etched from a bottom face of the holes 24 to form the concave portion 2 (FIG. 9). As an etching solvent used for this fabrication step, the anisotropic etching solvent such as TMAH or KOH is used.

After the concave portion 2 is formed, if necessary, a slimming process is performed to form shapes of the supporting wiring part 13 and the connection parts 12 consisting of the supporting legs 11 and the connection parts 12. For example, when the supporting insulating part 14 is made of silicon dioxide, the slimming process is performed by using fluorinated acid to lower the thermal conductance.

As described above, according to the first embodiment, the supporting part 4 supporting the detection cell 5 has two supporting legs 11 and a plurality of connection parts 12 connected to the supporting legs 11 at constant interval. Therefore, it is possible to reduce the distortion in the substrate-surface direction of the supporting legs 11, and to prevent the supporting legs 11 from contacting the substrate. As a result, there is no likelihood that the thermal conductance lowers, and sensitivity of the detection cell 5 does not lower, thereby fabricating a robust non-cooling type infrared ray detection device.

Furthermore, even if a location of forming the holes for forming the concave portion 2 shifts in some degree, there is no likelihood that the supporting legs 11 contact the substrate. Therefore, the mask matching accuracy is not required so much at a time of forming the holes 24, thereby simplifying the fabrication steps and improving fabrication yield.

Second Embodiment

A second embodiment has a characteristic in which a shape of the connection part 12 is different from that of the first embodiment.

Figure 10:
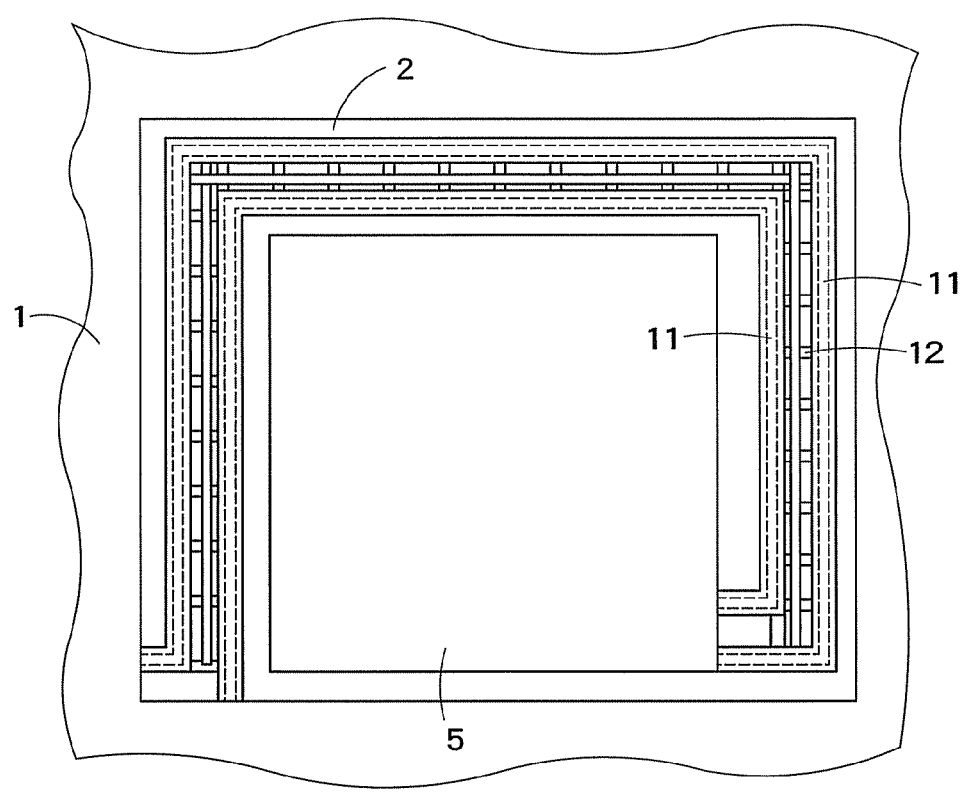
FIG. 10 is a plan view of the infrared ray detection device according to the second embodiment of the present invention.
Figure 11:
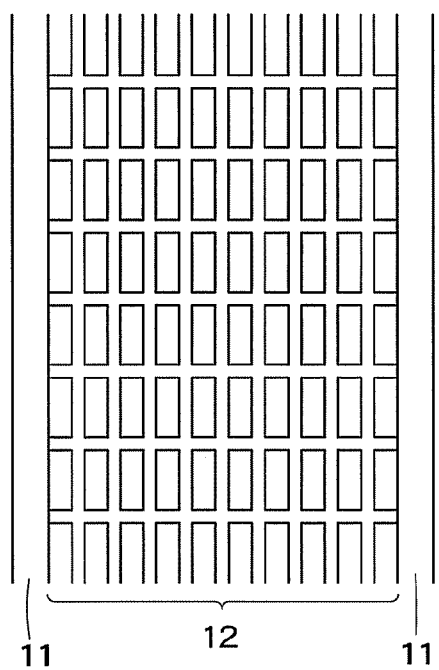
FIG. 11 is an enlarged view of the connection parts 12 of FIG. 10.

FIG. 10 is a plan view of the infrared ray detection device according to the second embodiment of the present invention. In FIG. 10, constituents common to those of FIG. 1 is denoted by the same reference numerals, and differences will be mainly described hereinafter. The infrared ray detection device of FIG. 10 is different from that of FIG. 1 in shape of the connection parts 12, and the other parts of FIG. 10 has the same structure as that of FIG. 1. FIG. 11 is an enlarged view of the connection parts 12 of FIG. 10. As shown in FIG. 11, the connection parts 12 have a mesh shape. The two connection supporting legs 11 are connected at larger number of locations than the connection parts 12 of FIG. 1. Therefore, the two supporting legs 11 are connected more firmly than that of the first embodiment, thereby furthermore reducing the distortion in the substrate-surface direction of the supporting legs 11.

When gaps formed by the mesh are buried with the insulating material or the like, heat current is branched to the buried portion, and the thermal insulation performance is deteriorated. Therefore, when the mesh structure shown in FIG. 11 is formed, it is necessary to prevent the gaps of the mesh from being buried.

The infrared ray detection device according to the second embodiment is fabricated by the same fabrication steps as those of FIGS. 5-9. When the connection parts 12 are formed by the fabrication step in FIG. 8, the etching such as RIE is performed by using the mask pattern in mesh shape, thereby forming the connection parts 12 in the mesh pattern.

As described above, according to the second embodiment, the two supporting legs 11 are connected by the connection parts 12 in mesh shape. Therefore, it is possible to more firmly connect the supporting legs 11, thereby reducing the distortion in the substrate-surface direction of the supporting legs 11.

The mesh shape may be lattice shape as shown in FIG. 11. Otherwise the mesh shape may be lozengy shape or random shape.

Third Embodiment

A third embodiment has a characteristic in which the supporting legs 11 are formed in zigzag shape.

FIG. 12 is a plan view of the infrared ray detection device according to the third embodiment of the present invention. In FIG. 12, constituents common to those of FIG. 1 is denoted by the same reference numerals, and differences will be mainly described hereinafter. The infrared ray detection device of FIG. 12 has two supporting legs 11 formed in turnover structure, i.e. zigzag shape, and a plurality of connection parts 12 arranged at constant interval in a direction orthogonal to a direction where the supporting legs 11 extends.

Different from the first and second embodiments, the supporting legs 11 of FIG. 12 does not have long side. Therefore, the shifted amount due to the stress decreases inevitably. In the third embodiment, the supporting legs 11 in zigzag shape are provided, and the supporting legs 11 are connected by the connection parts 12, thereby furthermore reducing the distortion in the substrate-surface direction of the supporting legs 11.

Fourth Embodiment

The first to third embodiments have one-side supporting structure which supports the detection cell 5 at only one side. On the other hand, a fourth embodiment has both-side supporting structure which supports the detection cell 5 at both sides opposite to each other.

FIG. 13 is a plan view of the infrared ray detection device according to the fourth embodiment of the present invention. In FIG. 13, constituents common to those of FIG. 1 are denoted by the same reference numerals, and differences will be mainly described hereinafter. The infrared ray detection device of FIG. 13 has a symmetric structure in which a center line B-B of the detection cell 5 is a symmetric axis.

The two supporting legs 11 are also symmetrically arranged, and the symmetric axis is the center line B-B. Two supporting legs 11 are connected adjacent to two sides of the detection cell 5 to form the both-side supporting structure.

In the structure of FIG. 13, base end portions of the two supporting legs 11, that is, locations where distances from connection points between the supporting legs 11 and the detection cell 5 is equal are connected by the connection parts 12. Because the supporting legs 11 have symmetric structure, temperature at both ends of the connection parts 12 is equal, and the thermal conductance of the supporting part 4 does not increase.

The distortion of the supporting legs 11 is reduced by providing the connection parts 12. Because it is also necessary to reduce the distortion in the depth direction of the substrate 1, the supporting legs 11 are connected in vicinity of two sides opposite to the detection cell 5 to form the symmetric structure. The detection cell 5 has very small distortion for the stress, compared with the supporting part 4. Therefore, it is possible to reduce the distortion in the depth direction of the semiconductor substrate 1 in the supporting legs 11 by connecting the two supporting legs 11 in vicinity of two sides opposite to each other in the detection cell 5.

Fabrication steps of the infrared ray detection device in FIG. 13 are the same as those of the first to third embodiments, and can be implemented only with modification of the mask pattern used in FIGS. 7 and 8.

As described above, according to the fourth embodiment, the two supporting legs 11 are symmetrically arranged and are connected adjacent to two sides opposite to each other in the detection cell 5. Therefore, it is possible to reduce not only the distortion in the substrate-surface direction, but also the distortion in the substrate-depth direction.

Fifth Embodiment

A fifth embodiment has a characteristic in which the detection cell 5 and the supporting part 4 are arranged up and down.

Figure 14:
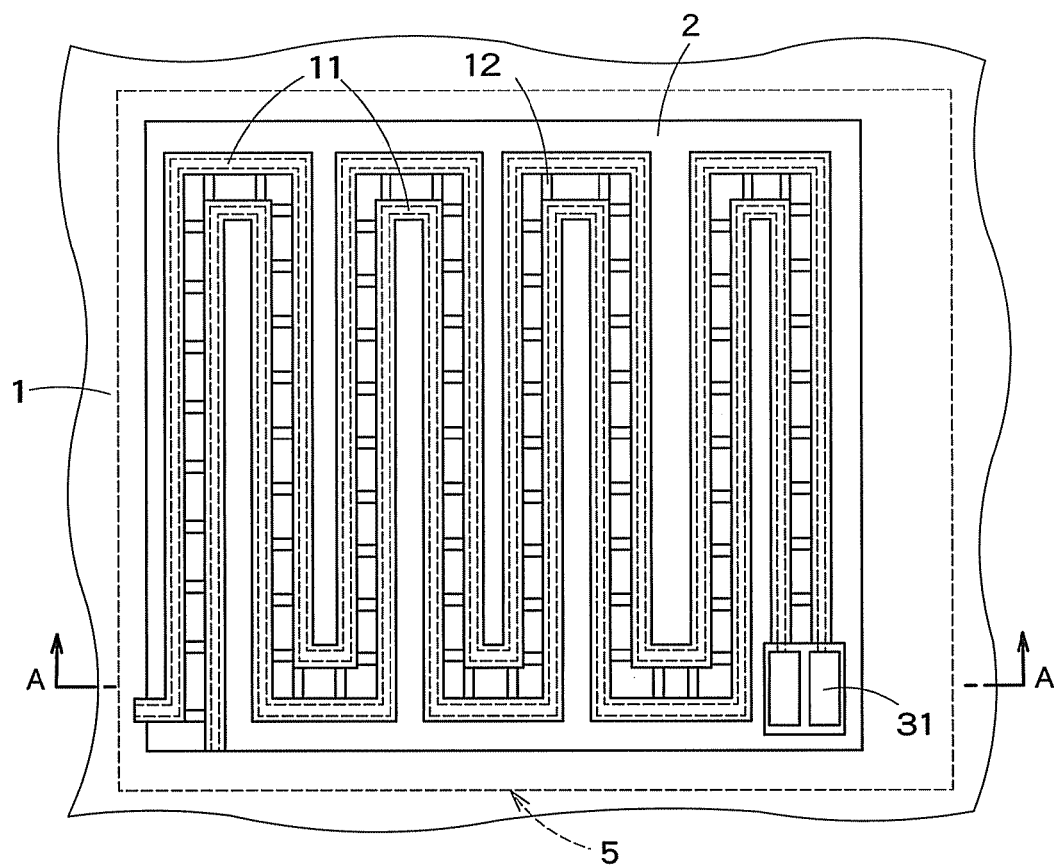
FIG. 14 is a plan view of the infrared ray detection device according to the fifth embodiment of the present invention.
Figure 15:
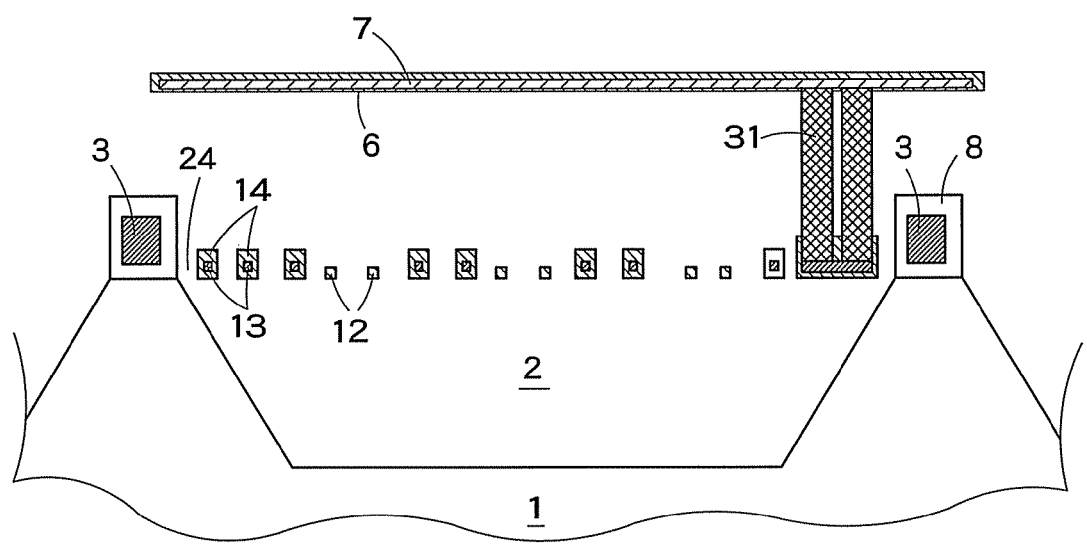
FIG. 15 is a cross-sectional view on line A-A in FIG. 14.

FIG. 14 is a plan view of the infrared ray detection device according to the fifth embodiment of the present invention, and FIG. 15 is a cross-sectional view on line A-A in FIG. 14.

The supporting part 4 according to the present embodiment has two supporting legs 11 formed in turnover structure, that is, zigzag shape, and a plurality of connection parts 12 connecting the supporting legs 11 at a constant interval. The supporting legs 11 are connected to the detection cell 5 arranged above the concave portion 2 via a contact 31 extending upward at a corner in the concave portion 2. The detection cell 5 has a size covering the whole concave portion 2, as shown in dotted line of FIG. 14.

It is possible to have the detection cell 5 of larger size than that of the first to third embodiments. Therefore, it is possible to enlarge absorption area of the infrared ray to enlarge "L" of the equation (2), thereby reducing the thermal conductance.

The shape of the supporting legs 11 may not necessarily be the turnover structure shown in FIG. 14, but be the shape shown in FIG. 1, 10 or 13.

Figure 16:
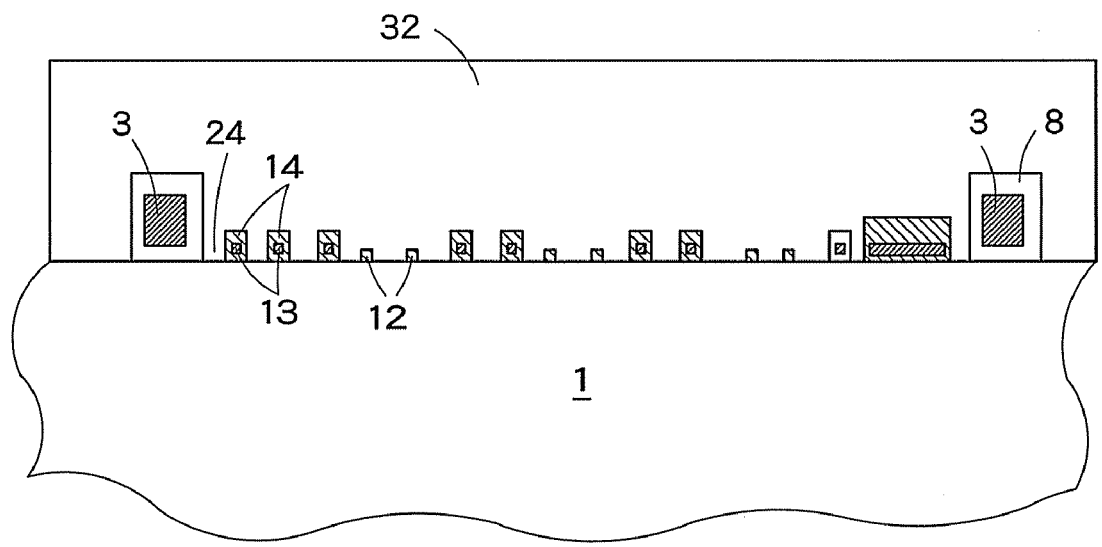
FIG. 16 is a cross-sectional view showing fabrication steps of the infrared ray detection devices according to the fifth embodiment.

FIGS. 16 to 19 are cross-sectional views showing fabrication steps of the infrared ray detection devices according to the fifth embodiment. The protective insulating film is formed on the semiconductor substrate 1, and the areas for the supporting wiring part 13, the supporting insulating part 14, the connection part 12 and the wiring part 3 are formed on the protective insulating film, and then the hole 24 for the concave portion 2 is formed on the substrate. Next, a sacrifice layer 32 made of an insulating material is formed on the whole substrate (FIG. 16).

Figure 17:
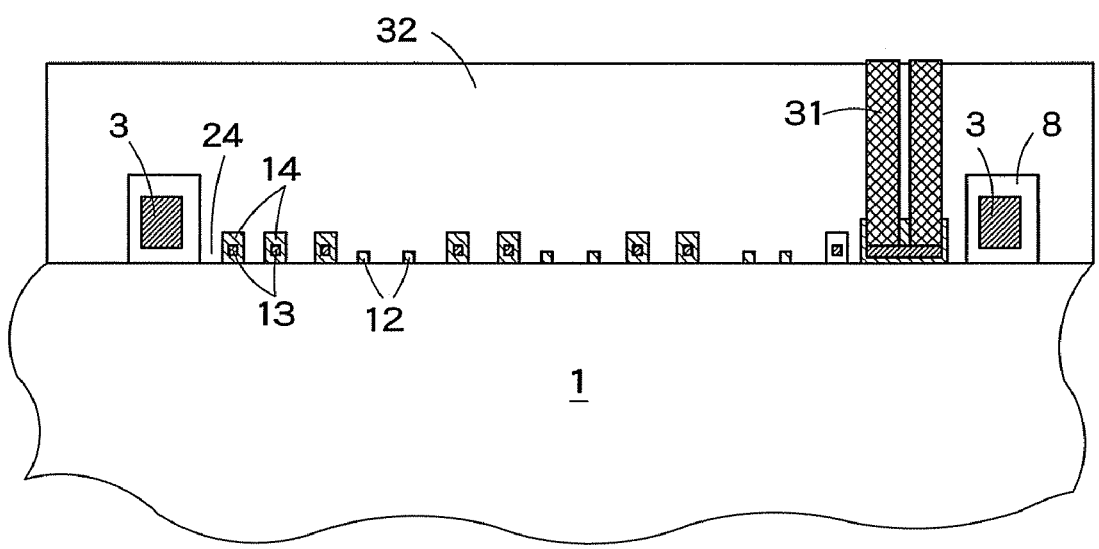
FIG. 17 is a view subsequent to FIG. 16.

Next, a portion of the sacrifice layer 32 is removed by etching to form a trench, and a conductive material is filled inside of the trench to form a contact 31 (FIG. 17).

Next, a thermoelectric conversion part 7 and the infrared ray absorption layer 6 are formed on the sacrifice layer 32 in order. If necessary, a frame is formed by etching (FIG. 18).

Next, the sacrifice layer 32 is removed, for example, by dry etching to expose the hole 24. The semiconductor substrate 1 contacting bottom face of the hole 24 is gradually etched to form the concave portion 2 (FIG. 19). An etching liquid to be used is desirably TMAH or KOH. Therefore, the infrared ray detection device having a structure of FIGS. 14 and 15 is obtained.

As described above, according to the fifth embodiment, the detection cell 5 is arranged above the supporting part 4. Therefore, it is possible to set size of the detection cell 5 larger than that of the concave portion 2. Because absorption area of the infrared ray enlarges, it is possible to improve detection sensitivity of the infrared ray. Because the supporting part 4 has the two supporting legs 11 and a plurality of connection parts 12 connected to the supporting legs, there is no likelihood that the supporting legs 11 distorts in the substrate-surface direction. Also there is no likelihood that sensitivity of the detection cell 5 lowers, and it is possible to fabricate a robust non-cooling type infrared ray detection device.

Sixth Embodiment

A sixth embodiment relates to an infrared ray camera having the infrared ray detection device according to the first, second or third embodiment.

FIG. 20 is a block diagram showing schematic configuration of the infrared ray camera according to the sixth embodiment of the present invention. The infrared ray camera of FIG. 20 has an infrared ray image pick-up apparatus 41 and a signal processing circuit 42. The infrared ray image pick-up apparatus 41 has a plurality of infrared ray detection devices 43 according to one of the first to fifth embodiments, which are arranged by every multiple pieces in row and column directions, a vertical selection circuit 44 which selects the infrared ray detection devices 43 in units of row, a plurality of amplifier circuits 45 provided corresponding to each column of the plurality of infrared ray detection devices 43, and a horizontal selection circuit 46 which selects the outputs of the amplifier circuits 45 in order.

The signal processing circuit 42 has a first amplifier 47 which amplifies the output signal of the infrared ray image pick-up apparatus 41, a background removing part 48 which removes a fixed pattern component at non-image pick-up time, a second amplifier 49 which amplifies the output signal of the background removing part 48, an A/D converting part 50 which performs A/D conversion for the output signal of the second amplifier 49, and an image processing calculator 51 which performs image correction process and the like based on the digital signal outputted from the A/D converting part 50. The output signal of the image processing calculator 51 is displayed on, for example, a display apparatus not shown.

The vertical selection circuit 44 in the infrared ray image pick-up apparatus 41 of FIG. 20 selects the output signal of the infrared ray detection device 43 in units of one line to apply a bias voltage. The horizontal selection circuit 46 sequentially selects and outputs the output signal of the infrared ray detection device 43 in a certain row selected by the vertical selection circuit 44. The signal processing circuit 42 displays the output signal by each pixel while scanning the screen in the horizontal direction.

As described above, according to the sixth embodiment, it is possible to constitute the infrared ray camera by arranging the infrared ray detection devices 43 according to the first to fifth embodiments in row and column directions.

What is claimed is:

1. An infrared ray detection device, comprising:
   a detection cell which has a thermoelectric converting part and an infrared ray absorption layer, the detection cell being formed via a space on a semiconductor substrate;
   a first wiring part formed on the semiconductor substrate; and
   a supporting part which supports the detection cell, wherein the supporting part includes:
   a plurality of supporting legs which have a second wiring part electrically connecting the first wiring part to the detection cell and an insulating part covering a surrounding area of the second wiring part; and
   at least one connection part made of an insulating material connecting the plurality of supporting legs to each other.

2. The device according to claim 1,
   wherein the connection part connects areas where temperatures in the supporting legs are substantially equal.

3. The device according to claim 1,
   wherein the space is a concave portion formed by removing a portion of the semiconductor substrate; and
   the connection part connects two pieces of the supporting legs arranged in substantially parallel inside of or above the concave portion in a direction substantially orthogonal to a direction where the supporting legs are extended.

4. The device according to claim 3,
wherein a plurality of connection parts are arranged at an interval substantially equal to each other.

5. The device according to claim 1,
wherein the connection part is formed in a mesh shape or a lattice shape, and connects the plurality of supporting legs at a plurality of locations.

6. The device according to claim 1,
wherein the supporting legs have turnover structures in which extended directions changes at a plurality of locations;
a plurality of connection parts are provided; and
the connection parts are arranged in directions of the supporting legs.

7. The device according to claim 1,
wherein the supporting part supports the detection cell at only one end portion side of the detection cell.

8. The device according to claim 1,
wherein the supporting part supports the detection cell at sides of two end portions opposite to each other, respectively.

9. The device according to claim 1, further comprising a contact extended up and down of the semiconductor substrate, the contact connecting the detection cell arranged in substantially parallel to one main surface of the semiconductor substrate to the supporting part.

10. A method of fabricating an infrared ray detection device, comprising:
forming a thermoelectric conversion part for a detection cell and a first wiring part for a supporting part on a semiconductor substrate;
covering the semiconductor substrate with a protective insulating part and forming a second wiring part;
removing a portion of the protective insulating part to expose the semiconductor substrate;
removing a portion of the semiconductor substrate from the exposed area of the semiconductor substrate to form a concave portion below the thermoelectric conversion part, the first wiring part and the surrounding protective insulating part; and
shaping a portion of the protective insulating part on the concave portion to form a plurality of supporting legs and at least one connection part which is made of an insulating material and connects the plurality of supporting legs, the supporting legs and the connection part constituting the supporting part.

11. The method according to claim 10, further comprising:
removing a portion of the protective insulating part on the concave portion after exposing the semiconductor substrate and before forming the concave portion.

12. An infrared ray camera, comprising:
an infrared ray detection apparatus which sequentially outputs an infrared ray detection signal detected by a plurality of infrared ray detection devices aligned in row and column directions; and
a signal processing circuit which performs signal process for the output signal of the infrared ray detection apparatus,
wherein each of the plurality of infrared ray detection devices has:
a detection cell which has a thermoelectric conversion part and an infrared ray absorption layer formed via a space on the semiconductor substrate;
a first wiring part formed on the semiconductor substrate; and
a supporting part which supports the detection cell formed on the semiconductor substrate,
the supporting part includes:
a plurality of supporting legs, each having a second wiring part electrically connecting the first wiring part and the detection cell, and a supporting insulating part covering a surrounding area of the second wiring part; and
at least one connection part made of an insulating material connecting the plurality of supporting legs to each other.

13. The camera according to claim 12,
wherein the connection part connects areas where temperatures in the supporting legs are substantially equal.

14. The camera according to claim 12,
wherein the connection part connects two pieces of the supporting legs arranged in substantially parallel inside of or above the concave portion in a direction substantially orthogonal to a direction where the supporting legs are extended.

15. The camera according to claim 14,
wherein a plurality of connection parts are arranged at an interval substantially equal to each other.

16. The camera according to claim 12,
wherein the connection part is formed in a mesh shape or a lattice shape, and connects the plurality of supporting legs at a plurality of locations.

17. The camera according to claim 12,
wherein the supporting legs have turnover structures in which extended directions changes at a plurality of locations;
a plurality of connection parts are provided; and
the connection parts are arranged in directions substantially orthogonal to the respective extended directions.

18. The camera according to claim 12,
wherein the supporting part supports the detection cell at only one end portion side of the detection cell.

19. The camera according to claim 12,
wherein the supporting part supports the detection cell at sides of two end portions opposite to each other, respectively.

20. The camera according to claim 12, further comprising a contact extended up and down of the semiconductor substrate, the contact connecting the detection cell arranged in substantially parallel to one main surface of the semiconductor substrate to the supporting part.

* * * * *